United States Patent
Belov

(10) Patent No.: US 7,212,056 B1
(45) Date of Patent: May 1, 2007

(54) RADIATION HARDENED LATCH

(75) Inventor: Vladimir Belov, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 30 days.

(21) Appl. No.: 11/248,690

(22) Filed: Oct. 12, 2005

(51) Int. Cl.
*H03K 3/356* (2006.01)

(52) U.S. Cl. .................. 327/210; 327/211; 327/212

(58) Field of Classification Search ................ 327/208, 327/210–212
See application file for complete search history.

(56) References Cited

U.S. PATENT DOCUMENTS

| | | | |
|---|---|---|---|
| 5,557,623 A | 9/1996 | Discoll | |
| 5,870,332 A | 2/1999 | Lahey et al. | |
| 6,002,970 A | 12/1999 | Abdelnour et al. | |
| 6,035,416 A | 3/2000 | Abdelnour et al. | |
| 6,127,864 A | 10/2000 | Mavis et al. | |
| 6,278,287 B1 | 8/2001 | Baze | |
| 6,326,809 B1 | 12/2001 | Gambles | |
| 6,327,176 B1 | 12/2001 | Li et al. | |
| 6,356,101 B1 | 3/2002 | Erstad | |
| 6,392,474 B1 | 5/2002 | Li et al. | |
| 6,448,862 B1 | 9/2002 | Yoder et al. | |
| 6,492,857 B2 | 12/2002 | Shuler | |
| 6,525,590 B2 | 2/2003 | Swonger | |
| 6,573,774 B1 | 6/2003 | Gardner | |
| 6,624,654 B1 | 9/2003 | Trimberger | |
| 6,642,802 B2 | 11/2003 | Knowles et al. | |
| 6,667,520 B1 | 12/2003 | Fulkerson | |
| 6,696,873 B2 | 2/2004 | Hazucha et al. | |
| 6,703,858 B2 | 3/2004 | Knowles et al. | |
| 6,753,694 B2 | 6/2004 | Eaton | |
| 6,756,809 B2 | 6/2004 | Eaton | |
| 7,068,088 B2 * | 6/2006 | Petersen | 327/208 |
| 2002/0060585 A1 | 5/2002 | Doyle et al. | |
| 2002/0063583 A1 | 5/2002 | Eaton | |
| 2002/0095641 A1 | 7/2002 | Cartagena | |
| 2003/0151429 A1 | 8/2003 | Eaton | |
| 2004/0007743 A1 | 1/2004 | Matsuda et al. | |

OTHER PUBLICATIONS

U.S. Appl. No. 11/266,447, filed Nov. 3, 2005, Mark E. Friedman.
Kochar, Mehul, et al., "Single Event Upsets in FPGAs," White Paper from QuickLogic Corporation, Revision A, Sep. 2003, pp. 1-11.

(Continued)

*Primary Examiner*—Kenneth B. Wells
(74) *Attorney, Agent, or Firm*—McDonnell Boehnen Hulbert & Berghoff LLP

(57) ABSTRACT

A radiation hardened latch is presented. The radiation hardened latch uses two redundant inverter paths to duplicate an input signal. The duplicated inverter paths are coupled with a radiation hardened inverter that will only produce an inverted signal if both input signals have equivalent voltage levels. The radiation hardened inverter and its output signal produce a radiation hardened node that drives either one of the duplicated inverter paths back to an appropriate voltage level in the event of an SET. Because, the radiation hardened node and duplicated inverter paths are isolated, the latch may be optimized for factors such as signal speed and driving strength. These factors may be optimized without affecting radiation hardness. The radiation hardened latch may also be used to build more complex circuits such as a flip-flop.

20 Claims, 4 Drawing Sheets

OTHER PUBLICATIONS

Dr. David G. Mavis, et al., "Draft Final Report: Development of a Design Methodology for Preventing Single Event Disruptions in Deep Submicron Microcircuits," Mission Research Corporation, Aug. 8, 2000, pp. 1-104.

Holman, Tim, "Circuit and Layout Issues," Radiation Effects on Microelectronics Short Couse, Vanderbilt University, Department of EECS, 2001.

Dr. David G. Mavis, et al., "SEU and SET Mitigation Techniques for FPGA Circuit and Configuration Bit Storage Design," 2000 Military and Aerospace Applications of Programmable Devices and Technologies Conference, Sep. 2000, pp. 1-15.

Dr. David G. Mavis, et al., "SEU and SET Mitigation Techniques for FPGA Circuit and Configuration Bit Storage Design," printed from the world wide web on Aug. 26, 2004, <http://klabs.org/richcontent/MAPLDCon00/Papers/Session_C/C5_Mavis_P.doc>, pp. 1-8.

Dr. David. G. Mavis, "Single Event Transient Phenomena—Challenges and Solutions," Microelectronics Reliability and Qualification Workshop, Dec. 2002, pp. 1-21.

Haas, Joe K., et al, "Mitigating Single Event Upsets From Combinational Logic," 7th NASA Symposium on VLSI Design 1998, pp. 1-10.

* cited by examiner

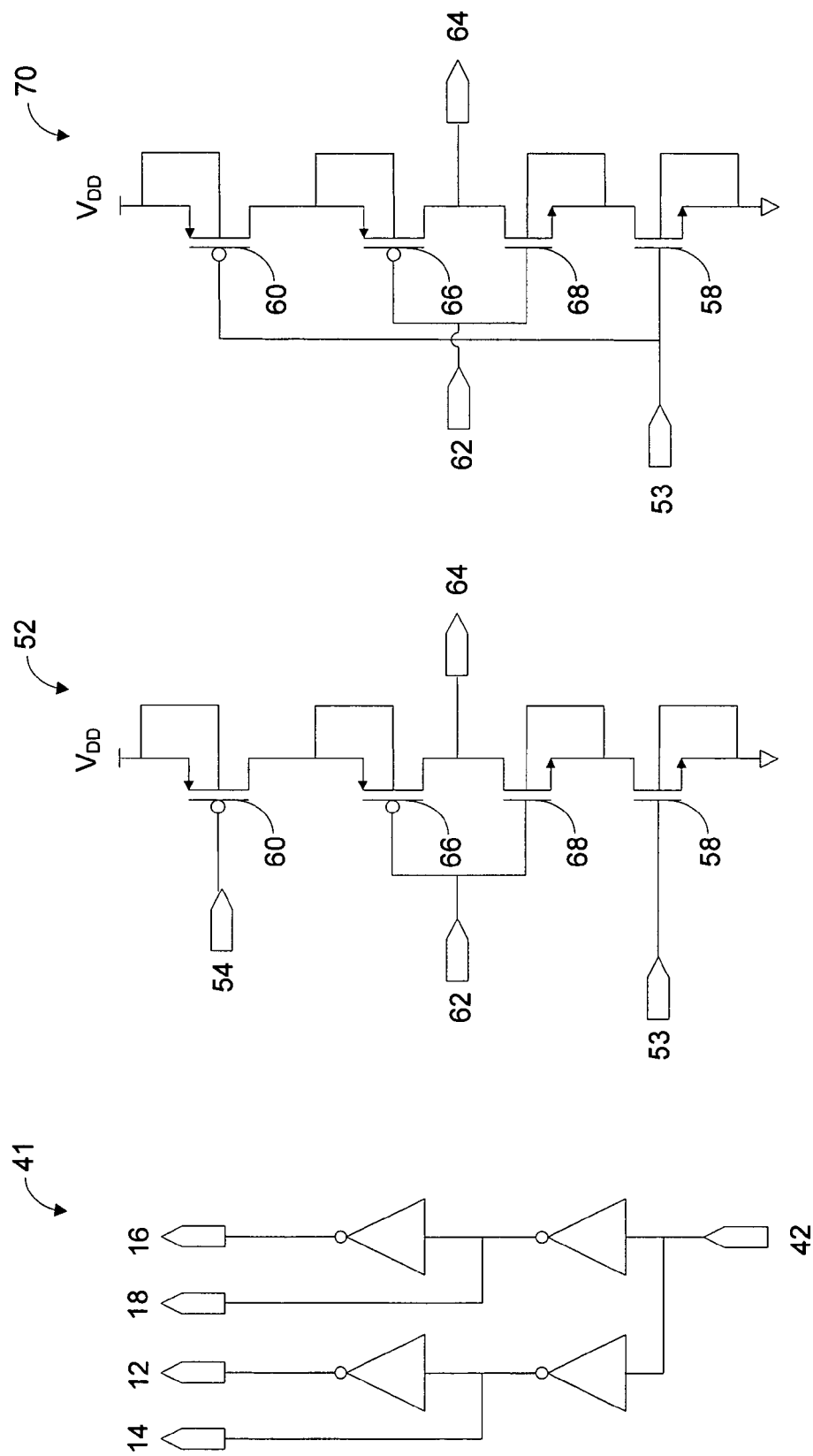

RADIATION HARDENED LATCH

FIELD

The present invention relates generally to a D-latch circuit, and more particularly, a radiation hardened latch.

BACKGROUND

D-Latches, also referred to as transparent latches, are a key component of any synchronous or asynchronous digital circuit that needs to store data and keep it unchanged within a certain period of a clock cycle. In its most common form, a conventional D-latch circuit is an electronic data storage device with a data input, a clock (or a write enable input), and a data output. When a D-latch receives a clock signal that is at the latch's enable logic level, the latch is "transparent" and its output signal at its data output equals the input signal at the data input. If the clock signal is reversed, or disabled, the data output maintains the same output signal it had before the clock became disabled. This signal, or value, will be maintained until the next clock switch, or enablement. This capability of maintaining the value of the output signal makes latch circuits a building block for a plurality of logic circuits and electronic devices.

Typically, latch circuits comprise logic gates. In a latch, the logic gates may be connected in various configurations in order to perform logic operations with an input data signal and a clock signal. These logic operations evaluate the data signal and the clock signal and produce an output signal. At a physical level the logic gates comprise transistors. Complimentary paired transistors are configured in multiple types of configurations in order to create a specific logic gate.

Because transistors are made of semiconductor materials that do not withstand ions transitioning through them, radiation events (e.g., particle strikes) may cause one or more transistors within a latch to become conductive and change state from "off" to "on". A radiation event, also referred to as a glitch, may initiate logical switching in a latch circuit which may result in two basic effects: a Single Event Transient (SET) or a Single Event Upset (SEU). Typically, within the duration of a glitch, a disturbed transistor will recover back to its off-state unless its control voltage level has been affected by the glitch.

The first effect, SET, by definition, is a glitch logically propagated from an affected node to the latch output. If such a glitch gets logically latched-in inside the latch and its output does not recover until the next clock cycle or enable signal then this effect becomes the second type of effect: an SEU or soft error. SEU events, more so than SET events, may be detrimental to a latch and circuits relying on the latch. The wrong output signal at the data output of a latch could cause circuits relying on the latch to be delayed or locked-up.

Therefore, a hardened latch is presented that prevents SEUs in the event of a SET.

SUMMARY

A radiation hardened latch that prevents SET events from causing an SEU is presented. In one embodiment, the latch comprises duplicated inverted signal nodes that are coupled with a Radiation Hardened inverter (RH-inverter). The RH-inverter produces a radiation hardened node (RH-node). When an SET occurs on a given node within the latch, the RH-node causes the voltage at the node that had the SET to recover to a correct voltage level. The RH-inverter prevents an erroneous output at the RH-node by only inverting the input signal when the duplicated nodes have equivalent voltages.

In a further embodiment, the radiation hardened latch is driven by a clock buffer circuit. The clock buffer circuit isolates the clock signal into multiple clock paths so that a common clock node will not cause an SEU event.

In an additional embodiment, a flip-flop is constructed from two radiation hardened latches. The flip-flop maintains isolation of RH-nodes and signal propagation nodes. The hardened latch and/or flip flop may be used to produce a variety of additional circuitry.

These as well as other aspects and advantages will become apparent to those of ordinary skill in the art by reading the following detailed description, with reference to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 3a is a circuit diagram of clock buffer used to drive clock inputs of a radiation hardened latch in accordance with one embodiment of the present invention;

FIG. 3b is a circuit diagram of an example tri-state inverter;

FIG. 3c is a circuit diagram of a tri-state inverter in a radiation hardened configuration in accordance with one embodiment of the present invention;

DETAILED DESCRIPTION

A radiation hardened latch that prevents single event upsets (SEU) due to single event transients (SET) is presented. The radiation hardened latch, operates as a conventional latch in operation; however, internal to the latch is a redundant circuit and a radiation hardened node (RH-node) that maintains a stable output in the event of an SET. The redundant circuit and the RH-node are isolated from each other in the sense that the critical signal paths do not travel through the RH-node. This allows for the optimization of signal speed and output load while maintaining SEU hardness.

Figure 1:
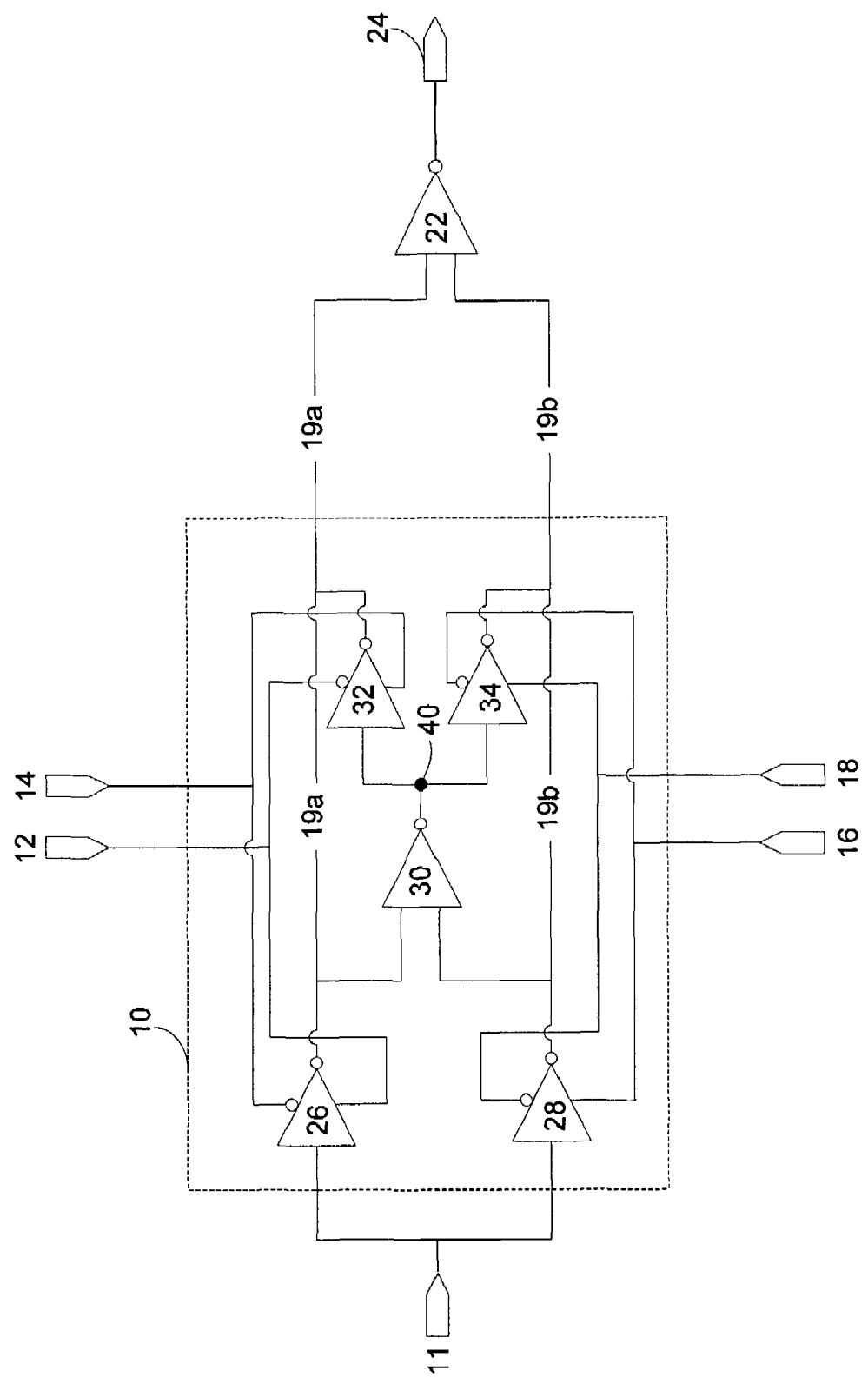
FIG. 1 is a circuit diagram of a radiation hardened latch in accordance with one embodiment of the present invention.

Turning now to FIG. 1, a radiation hardened latch 10 receives a signal input 11 and clock inputs 12, 14, 16, and 18. Clock inputs 14, 18 are inverse signals of clock inputs 12, 16. A two input inverter circuit 22 is coupled with latch 10 in order to produce an SEU free latch output 24.

Inverters 26, 28 receive a latch data input signal at latch input 11 and output an inverted data signal at nodes 19a, 19b respectively. Inverter 26 is enabled with clock input 12 and inverted clock input 14. Inverter 28 is enabled with clock input 16 and inverted clock input 18. An output of inverter 26 is coupled with one input of inverter 30 and an output of inverter 28 is coupled with a second input of inverter 30. An output of inverter 30 is used as latch output 24 and an input to inverters 32 and 34. Inverter 32 is enabled by the inverted clock input 14 and the clock input 12. Similarly, inverter 34 is enabled by the inverted clock input 18 and the clock input 16. The outputs of inverters 32 and 34 are coupled to nodes 19a and 19b respectively. Nodes 19a and 19b are coupled with the two input inverter 22. The inverter 22 may be a radiation hardened inverter. An example radiation hardened inverter is described in further detail with reference to FIG. 3c.

In operation, the latch data input signal at latch input 11 will be inverted at the output of inverters 26 and 28 when the clock signals 12, 14, 16, 18 enable both of these inverters. For example, if latch input 11 is "high" and clock input 12 and inverted clock input 14 are "high" and "low" respectively, inverter 26 will output a "low" signal. In the same manner, if clock input 16 and inverted clock input 18 are "high" and "low" respectively, inverter 28 will output a "low" signal. In this example, if the input clock signals 12, 16 and inverted clock signals 14, 18 become non-enabling, the inverter outputs 26, 28 will remain "low" even if the latch input goes "high".

In examining the outputs of inverters 26, 28, if everything is operating correctly (i.e., no SET has occurred), nodes 19a and 19b should be equal to each other. If, however, an SET occurs (e.g., particle radiation), nodes 19a and 19b will have a different value for the transient duration of the SET. When this happens, the voltages entering inverter 30 will have different values. Inverter 30 acts as a voter; when both nodes 19a and 19b are equal, an inverse signal of nodes 19a and 19b is formed at radiation hardened (RH)-node 40. If, however, nodes 19a and 19b are different, the signal at RH-node 40 floats. RH-node 40 will retain the value it had prior to nodes 19a and 19b differing in voltage. On the other hand, if an SET occurs and either node 19a or 19b changes in voltage, RH-node 40 will not change in value. Therefore, RH-node 40 is a radiation hardened representation of nodes 19a and 19b. Furthermore, inverter 30 is designed so that RH-node 40 is not vulnerable to SET events caused by particle hits to the inverter itself. An example inverter that may be used as inverter 30 will be further described with reference to FIG. 3c.

RH-node 40 is used to drive inverters 32 and 34. Inverters 32 and 34 are enabled at opposite time periods when compared to inverters 26 and 28. For example, inverter 32 is enabled when inverted clock signal 14 goes "high" and clock signal 12 goes "low". Inverter 34 is enabled when inverted clock signal 18 goes "high" and clock signal 16 goes "low". Basically, inverters 32 and 34 are shifted 180 degrees out of phase when compared to the phase of inverters 26 and 28. When an SET occurs, RH-node 40 will drive both inverters 32 and 34 so that node 19a or 19b will return to the voltage level that it had before the SET occurred. The phase shift, as described above, allows inverters 32, 34 to maintain a charge so that nodes 19a and 19b can be returned to the correct voltage level that was being output before the SET occurred. In addition, because SET events typically are very short, inverters 32 and 34 input nodes will not significantly discharge when an SET occurs.

Figure 2B:
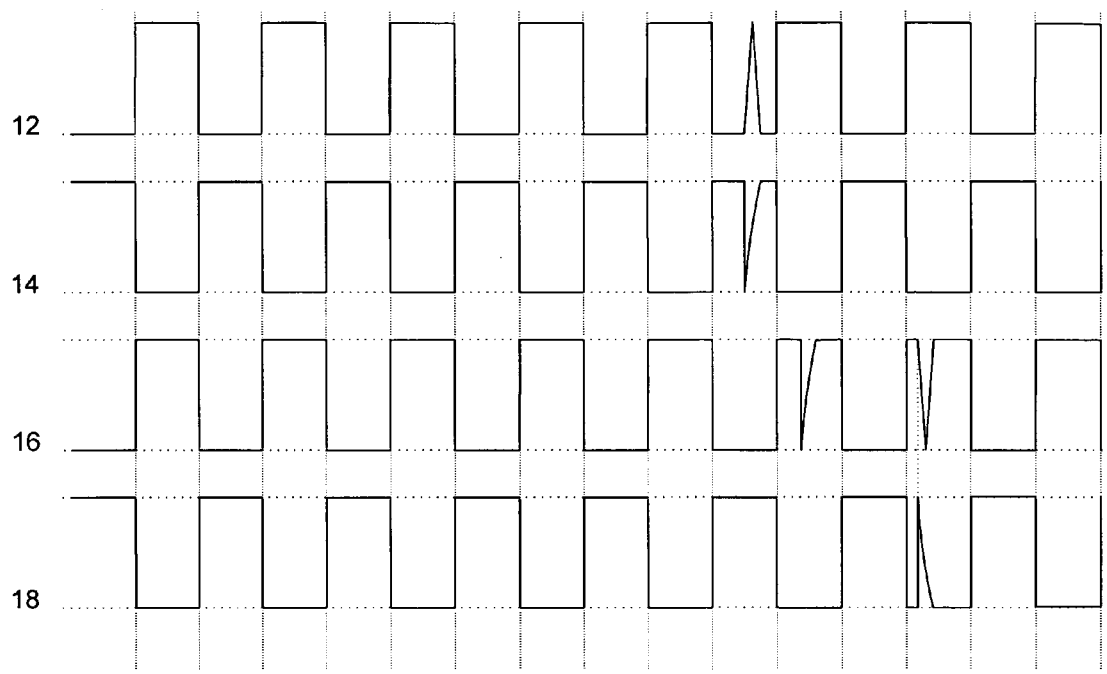
FIG. 2 is a timing diagram of a radiation hardened latch illustrating SEU prevention in accordance with one embodiment of the present invention.
Figure 2A:
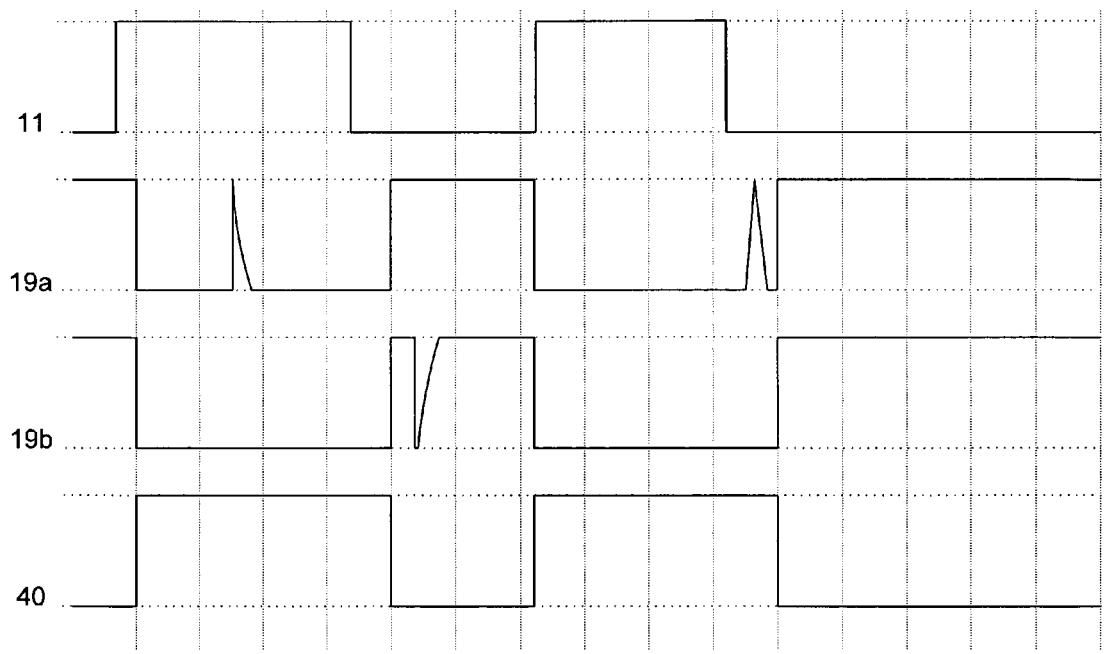

FIG. 2a illustrates timing diagrams for the latch 10 in the event of an erroneous SET induced voltage. In this example, latch input 11 has a signal that is pulsed "high" twice. During the first pulse, an SET occurs at node 19a. The voltage spikes from a "low" value to a "high" value. When this spike occurs, RH-node 40 maintains a "high" voltage in order to drive the output of inverter 32 (node 19a) back to a "low" output level. RH-node 40 may discharge slightly during the SET and an insignificant change in voltage may occur. However, as discussed above, the SET is a short event and RH-node 40 will not discharge once node 19a has been restored.

Also illustrated in FIG. 2a, when signal 11 goes "low" after the first pulse, another SET occurs on node 19b. In this example RH-node 40 maintains a "low" input into inverter 34. Again, RH-node 40 may charge insignificantly until node 19b is restored to a "high" value. The redundant nodes 19a and 19b allow latch 10 to be restored when either node is affected. Because nodes 19a and 19b are electrically separate from each other and because SET events occurring in close proximity and short time intervals are very low probability events, the probability of both nodes 19a and 19b being affected by simultaneous SET's is much lower than the probability of an SET event occurring. In addition to nodes 19a and 19b being SEU hard (via RH-node 40), other nodes within the circuit are SEU hard as a result of RH-node 40, particularly the clock and inverse clock nodes coupled to clock inputs 12, 14, 16, and 18.

FIG. 2b depicts behavior of the latch nodes when a single particle strikes occur to a clock buffer circuit (a clock buffer circuit is further described with reference to FIG. 3a). SET glitches induced by clock disturbances may only propagate to nodes 19a or 19b. Similar to FIG. 2a, these glitches are cancelled by inverter 30.

As described above, clock inputs 12, 14, 16, and 18 are each used to enable inverters 26, 28, 32 and 34. A clock buffer circuit is used to create clock inputs 12, 14, 16, and 18. One example clock buffer circuit 41 is illustrated in FIG. 3a. An input clock signal 42 is divided into four clock signals that are physically isolated from each other. If the clock signals paths were not isolated, an SET could upset the entire latch 10 at an input clock signal path. When a particle hit occurs at inverter 44 or inverter 46, the SET propagates through inverter 48 or inverter 50 respectively. An SET glitch will only affect inverters 26 and 32 or inverters 28 and 34. In addition, with proper inverter selection, an SET glitch is not sufficient to cause inverter 30 to produce an erroneous output.

By nature of its design, the latch 10 illustrated in FIG. 1, may be optimized for speed or radiation hardness. Basically, the signal path is inherently isolated from RH-node 40. Because of this, inverters 26 and 28 may be substantially different in design than inverters 30, 32 and 34. Inverters 30, 32, and 34 only need to insure that RH-node 40 does not change when an SET occurs; speed may not be as important for these inverters. Inverters 30, 32, and 34 may be smaller and consume less circuit area than inverters 26, 28. Inverters 32 and 34, in a keeper loop configuration, may be replaced with a standard inverter that acts as a ring latch. Inverters 26 and 28 may be designed to be larger for large loads or optimized for faster switching speeds. Again, because the radiation component and signal components are separate, latch 10 may be optimized for a circuit designer's preferences.

The inverters 26, 28, 30, 32 and 34 may be referred to as tri-state inverters because they also have an enable input. In FIG. 3b, a circuit diagram of one such tri-state inverter 52 is illustrated. Within tri-state inverter 52, a first clock input 53 is input into NMOS transistor 58 and second clock input 54 is input into PMOS transistor 60. Input 62 is coupled with the gate of PMOS transistor 66 and NMOS transistor 68. The output 64 is coupled with the drains of PMOS transistor 66 and NMOS transistor 68. When the tri-state inverter 52 is enabled at the first and second clock inputs 53 and 54, the tri-state inverter 52 functions as inverter.

Alternative to the configurations of inverters 26, 28, 32 and 34, the tri-state inverter 52 may be configured to be a radiation hardened (RH)-inverter 70 as is shown FIG. 3c. By coupling input 53 to both inputs of transistors 58 and 60, RH-inverter 70 is in a voter configuration. RH-inverter may be used for inverter 30 and inverter 22. In addition, output 64 may be used for RH-node 40. Output 64 (RH-node 40) in this configuration, maintains its radiation hardness by only allowing a signal transition when inputs 53 and 62 are logically equivalent.

More specifically, when inputs 53 and 62 of RH-inverter 70 have the same logic state, each series of stacked transistors, 60, 66 and 58, 68, function as single transistors of aggregated channel length. If inputs 53 and 62 have different logic states then each of the stacked transistor pairs become nonconductive as one transistor in the stack is "on" while the other is "off." In the "off" state, the inverter 70 does not drive its output. Therefore, if the output of inverter 30 is loaded with only the inputs of other gates, RH-node 40 will maintain a correct logic level until leakage and cross coupling noise currents cause RH-node 40 to discharge. As described above, however, an SET's duration is not significant to cause RH-node 40 to discharge.

Table 1 represents a truth table for inverter 30 using the configuration of RH-inverter 70 in FIG. 3c.

TABLE 1

RH-Inverter 70 (inverter 30) truth table

| Enable inputs 53 (Node 19a) | Input 62 (Node 19b) | Output 64 (RH-Node 40) |
| --- | --- | --- |
| High | High | High |
| High | Low | Float (High Impedance) |
| Low | High | Float (High Impedance) |
| Low | Low | Low |

To insure that RH-node 40 remains radiation hardened, transistors 58 and 60 should not be in close proximity to transistors 66 and 68. Depending on the CMOS fabrication process and particle stroke angle, if transistors 58 and 60 are too close to complementary transistors 66 and 68, a single particle stroke may hit both transistors in the stack and make it conductive. The current through those transistors may override the complementary transistors that are turned on normally. A pull-up or pull-down path may be created and RH-node 40 would not be radiation hardened. However, if design consideration in the placement of transistors 58, 60, 66 and 68 is given, an SET will not be able to affect RH-node 40.

It should be noted that many other types of radiation hardened inverters may be used for inverter 30 or inverter 22. The latch 10 is not limited to using only one type of radiation hardened inverter to be used in the creation of RH-node 40. As long as RH-node 40 is not disturbed by SET events, the design of inverter 30 can vary.

Figures 4A, 4B, 4C:
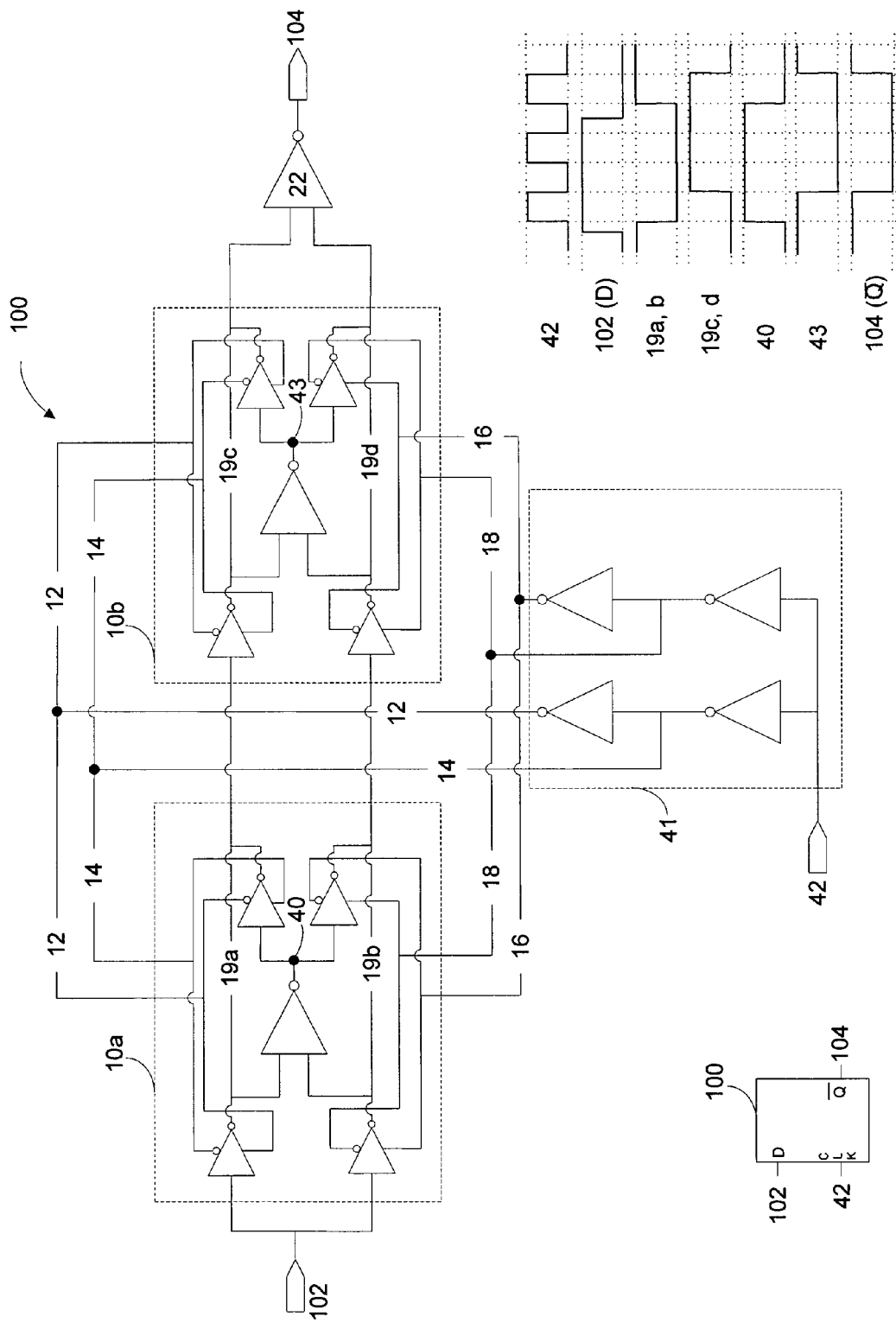
FIG. 4a is a block diagram illustrating external inputs and outputs of a flip-flop comprising radiation hardened latches in accordance with one embodiment of the present invention.
FIG. 4b is a circuit diagram of a flip-flop comprising radiation hardened latches in accordance with one embodiment of the present invention.
FIG. 4c is a timing diagram illustrating operation of a flip-flop comprising radiation hardened latches in accordance with one embodiment of the present invention.

The SEU hard latch 10 may be used to construct additional circuit components. One such circuit component is a D-type flip-flop. FIG. 4a illustrates a symbolic representation of a flip-flop 100 that is comprised of two latches. Data input 102 and a clock input 42 are input Output 104 is an inverted clocked data output.

FIG. 4b illustrates how two latch 10a, b circuits are used to build an SEU hardened flip-flop 100. In FIG. 4b, two latch 10a, b circuits are interconnected so that the output of latch 10a is input into latch 10b. Also input into both latch circuits is clock buffer 41. In this example, each latch receives complimentary clock inputs. For example, latch 10b receives signal 14 as a clock input; latch 10a, however, receives signal 14 as an inverse clock input. Inverter circuit 22 is also coupled to inverted output 104 of the flip-flop 100.

Because flip-flop 100 is constructed from hardened latches, the signal path and radiation hardened nodes remain separated from each other. Four nodes, 19a–d, represent signal propagation nodes within both latch 10a, b circuits. Two radiation hardened nodes 40, 43 prevent SEU effects in the flip-flop 100. FIG. 4c illustrates node voltages for a "high" and "low" input 102 into flip-flop 100.

If a flip-flop with non-inverted data output is desired, then inverters coupled to the duplicated nodes of latch 10a or latch 10b may be added. The coupled inverters may be used not only to provide for specific output logic levels, but also to adjust flip-flop speed/power performance. As a faster option, instead of inverter 22, a pair of regular inverters with tightly regulated outputs may be used. In this configuration, flip-flop 100 would remain SEU-hard, although SET glitches from nodes 19c and 19d may propagate to the output 104. In further embodiments, flip-flop 100, could be used as a building block for more complex circuits in the same manner that latch 10 was used to construct flip-flop 100.

Overall, the above embodiments describe a radiation hardened latch that comprises a duplicated signal path reinforced by a radiation hardened node. Upon receiving an enabling clock signal, the latch inverts an input voltage and holds the inverted voltage value when the clock signal is not enabling. A radiation hardened node is created by a radiation hardened inverter, such as a tri-state inverter in a voting scheme, that compares both duplicated signals and will only invert the duplicated signals when they are equal. Because SET glitches are brief and affect nodes intermittently, the radiation hardened node drives an SET induced voltage swing back to a correct logic level.

Because the radiation hardened latch may be used to construct circuits such as a flip-flop or other more complex circuits, it should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A radiation hardened latch, comprising:
a first inverter having an output;
a second inverter having an output;
a radiation hardened inverter having an output, a first input coupled with the first inverter output, and a second input coupled with the second inverter output;
a third inverter having an input coupled with the radiation hardened inverter output and an output coupled with the first inverter output; and a fourth inverter having an input coupled with the radiation hardened inverter output and an output coupled with the second inverter output.

2. The device as in claim 1, further comprising:
first and second clock inputs, the first clock input coupled with an enable input of the first inverter and the second clock input coupled with an enable input of the second inverter; and
first and second inverted clock inputs, the first inverted clock input coupled with an enable input of the third inverter and the second clock input coupled with an enable input of the fourth inverter.

3. The device as in claim 2, further comprising a clock buffer coupled to the first and second clock inputs and the first and second inverted clock inputs.

4. The device as in claim 3, wherein the clock buffer comprises:
a third clock input;
a fifth inverter having an input coupled with the third clock input, and an output coupled with the first inverted clock input;
a sixth inverter having an input coupled with the third clock input, and an output coupled with the second inverted clock input;
a seventh inverter having an input coupled with the output of the fifth inverter and an output coupled with the first clock input; and
an eighth inverter having an input coupled with the output of the sixth inverter and an output coupled with the second clock input.

5. The device as in claim 1, wherein the radiation hardened inverter comprises a series of stacked transistors.

6. The device as in claim 5, wherein the series of stacked transistors comprises first and second PMOS transistors and first and second NMOS transistors, each of the PMOS and NMOS transistors having a gate, a drain, and a source, and wherein the gate of the first PMOS transistor is coupled with the output of the second inverter and the gate of second NMOS transistor, the source of the second PMOS transistor is coupled with the drain of the first PMOS transistor, the drain of the second PMOS transistor is coupled with the drain of the first NMOS transistor and the output of the radiation hardened inverter, the gate of the second PMOS transistor is coupled with the gate of the first NMOS transistor and the output of the first inverter, and the drain of the second NMOS transistor is coupled with the source of the first NMOS transistor.

7. The device as in claim 2, wherein the first inverter has an inverse enable input coupled with the first inverse clock input, the second inverter has an inverse enable input coupled with the second inverse clock input, the third inverter has an inverse enable input coupled with the first clock input, and the fourth inverter has an inverse enable input coupled with the second clock input.

8. The device as in claim 1, wherein a second radiation hardened inverter has a first input coupled with the output of the first inverter and a second input coupled with the output of the second inverter.

9. A radiation hardened latch, comprising:
a first pair of inverters comprising a first inverter and a second inverter having interconnected outputs, wherein the first inverter has an enable input coupled with an inverted enable input of the second inverter and the second inverter has an enable input coupled with an inverted enable input of the first inverter;

a second pair of inverters comprising a third inverter and a fourth inverter having interconnected outputs, wherein the third inverter has an enable input coupled with an inverted enable input of the fourth inverter and the fourth inverter has an enable input coupled with an inverted enable input of third inverter; and
a radiation hardened inverter having an output, an input coupled with interconnected outputs of the first pair of inverters, and enable and inverted enable inputs coupled with the interconnected outputs of the second pair of inverters.

10. The device as in claim 9, further comprising a clock buffer coupled with the enable and inverted enable inputs of the first and third inverters.

11. The device as in claim 10, wherein the clock buffer comprises:
a clock input;
an fifth inverter having an input coupled with the clock input, and an output coupled with the inverted enable input of the first inverter;
a sixth inverter having an input coupled with the clock input, and an output coupled with the inverted enable input of the third inverter;
a seventh inverter having an input coupled with the output of the fifth inverter and an output coupled with the enable input of the first inverter; and
an eighth inverter having an input coupled with the output of the sixth inverter and an output coupled with the enable input of the third inverter.

12. The device as in claim 9, wherein the radiation hardened inverter comprises a series of stacked transistors.

13. The device as in claim 12, wherein series of stacked transistors comprises first and second PMOS transistors and first and second NMOS transistors, each of the PMOS and NMOS transistors having a gate, a drain, and a source, and wherein the gate of the first PMOS transistor is coupled with the output of the second inverter and the gate of second NMOS transistor, the source of the second PMOS transistor is coupled with the drain of the first PMOS transistor, the drain of the second PMOS transistor is coupled with the drain of the first NMOS transistor and the output of the third inverter, the gate of the second PMOS transistor is coupled with the gate of the first NMOS transistor and the output of the first inverter, and the drain of the second NMOS transistor is coupled with the source of the first NMOS transistor.

14. The device as in claim 9, wherein a two input inverter has a first input coupled with the interconnected outputs of the first pair of inverters and a second input coupled with the interconnected outputs of the second pair of inverters.

15. The device as in claim 14, wherein the two input inverter is radiation hardened.

16. The device as in claim 13, wherein a two input inverter has a first input coupled with the interconnected outputs of the first pair of inverters and a second input coupled with the interconnected outputs of the second pair of inverters.

17. A method of operating a radiation hardened latch, the method comprising:
inputting a latch input into first and second inverters;
enabling the first and second inverters at a periodic interval;
inputting an output of the first inverter into a first input of a radiation hardened inverter and inputting an output of the second inverter into a second input of the radiation hardened inverter, whereby a radiation hardened node is maintained at an output of the radiation hardened inverter;
outputting the radiation hardened node into third and fourth inverters;
enabling the third and fourth inverters at an inverse periodic interval;
combining an output of the third inverter to the output of the first inverter at a first output node;
combining an output of the fourth inverter with the output of the second inverter at a second output node; and
in the event of an SET, maintaining a voltage level at the first and second output nodes by the radiation hardened node.

18. The method of claim 17, further comprising:
inverting the first and second output nodes via a fifth inverter; and
receiving an output of the fifth inverter at a latch output.

19. The method of claim 17, wherein the periodic interval and the inverse periodic interval is determined by a clock generation circuit.

20. The method of claim 19, wherein the clock generation circuit is a clock buffer circuit, and wherein the clock buffer circuit isolates the periodic interval and the inverse periodic interval.

* * * * *